United States Patent
Frank et al.

(10) Patent No.: US 7,521,376 B2
(45) Date of Patent: Apr. 21, 2009

(54) METHOD OF FORMING A SEMICONDUCTOR STRUCTURE USING A NON-OXYGEN CHALCOGEN PASSIVATION TREATMENT

(75) Inventors: Martin M. Frank, Bronx, NY (US); Steven J. Koester, Ossining, NY (US); John A. Ott, Greenwood Lake, NY (US); Huiling Shang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 11/259,165

(22) Filed: Oct. 26, 2005

(65) Prior Publication Data

US 2007/0093074 A1    Apr. 26, 2007

(51) Int. Cl.
    *H01L 21/469* (2006.01)
(52) U.S. Cl. .................. 438/778; 438/758; 438/765
(58) Field of Classification Search .......... 438/758–794
    See application file for complete search history.

(56) References Cited

U.S. PATENT DOCUMENTS

| | | | |
|---|---|---|---|
| 6,475,857 B1 * | 11/2002 | Kim et al. | 438/240 |
| 2004/0087117 A1 * | 5/2004 | Leitz et al. | 438/492 |
| 2004/0094804 A1 * | 5/2004 | Amos et al. | 257/369 |
| 2004/0173790 A1 * | 9/2004 | Yeo et al. | 257/19 |
| 2006/0099782 A1 * | 5/2006 | Ritenour | 438/542 |

OTHER PUBLICATIONS

Zhang, X.-J. et al., "Thermal Desorption of Ultraviolet-Ozone Oxidized Ge(001) for Substrate Cleaning," 11(5) *J. Vac. Sci. Technol.* September/October, 2553 (1993).
Chen, James J. et al., "Ultrathin Al2O3 and HfO2 Gate Dielectrics on Surface-Nitrided Ge," 51(9) *IEEE Transactions on Electronic Devices* September, 1441 (2004).
Chui, Chi et al. "Atomic Layer Deposition of High-? Dielectric for Germanium MOS Applications—Substrate Surface Preparation," 25(5) *IEEE Electron Devices Letters* May, 274 (2004).
Gusev, E.P. et al., "Microstructure and Thermal Stability of HfO2 Gate Dielectric Deposited on Ge(100)," 85(12) *Applied Physics Letters* September, 2334 (2004).
Wu, Nan et al., "Effect of Surface NH3 Anneal on the Physical and Electrical Properties of HfO2 Films on Ge Substrate," 84(19) *Applied Physics Letters*, May, 3741 (2004).

(Continued)

*Primary Examiner*—David Vu
*Assistant Examiner*—Andres Lopez Esquerra
(74) *Attorney, Agent, or Firm*—Scully, Scott, Murphy & Presser, P.C.; Robert M. Trepp, Esq.

(57) ABSTRACT

A method and structure in which Ge-based semiconductor devices such as FETs and MOS capacitors can be obtained are provided. Specifically, the present invention provides a method of forming a semiconductor device including a stack including a dielectric layer and a conductive material located on and/or within a Ge-containing material (layer or wafer) in which the surface thereof is non-oxygen chalcogen rich. By providing a non-oxygen chalcogen rich interface, the formation of undesirable interfacial compounds during and after dielectric growth is suppressed and interfacial traps are reduced in density.

9 Claims, 6 Drawing Sheets

OTHER PUBLICATIONS

Göthelid, M., "Etching and a Disordered Overlayer on the Ge(100)-S Surface," 115 *Applied Surface Science*, 87 (1997).

Anderson, G.W. et al., "The S-Passivation of Ge(100)-(1×1)," 66(9) *Applied Physics Letters*, 1123 (1995).

Lyman, P.F. et al., "Structure of a Passivated Ge Surface Prepared from Aqueous Solution," 462 *Surface Science*, L594 (2000).

Bodlaki, D. et al., "Infrared Second Harmonic Generation Spectroscopy of Ge(111) Interfaces," 119(7) *Journal of Chemical Physics*, August, 3958 (2003); and.

Bodlaki, D. et al., "Ambient Stability of Chemically Passivated Germanium Interfaces," 543 *Surface Science*, July, 63 (2003).

* cited by examiner

METHOD OF FORMING A SEMICONDUCTOR STRUCTURE USING A NON-OXYGEN CHALCOGEN PASSIVATION TREATMENT

FIELD OF THE INVENTION

The present invention relates to semiconductor device manufacturing, and more particularly to a method of fabricating a semiconductor structure such as, for example, a field effect transistor (FET) or a metal-oxide-semiconductor (MOS) capacitor, located atop and/or within a Ge-containing material that includes a surface (i.e., upper surface and/or trench surface) forming an interface with an abutting dielectric that is rich in one or more chalcogens other than oxygen (herein denoted as 'non-oxygen chalcogen'). That is, the method of the present invention creates a non-oxygen chalcogen rich interface between a Ge-containing material and a dielectric. The present invention also relates to a semiconductor structure such as, for example, a FET or MOS capacitor, located atop and/or within a Ge-containing material wherein an interface that is non-oxygen chalcogen rich is located between the Ge-containing material and an abutting dielectric.

BACKGROUND OF THE INVENTION

The lower effective mass and higher mobility of carriers in germanium (Ge) as compared to silicon (Si) has prompted renewed interest in Ge-based devices for high performance logic, especially as it becomes increasingly difficult to enhance Si complementary metal oxide semiconductor (CMOS) performance through traditional scaling. Typically, Ge has a 2× higher mobility for electrons and a 4× higher mobility for holes than a conventional Si material. One major roadblock for Ge CMOS device fabrication is that it is very difficult to obtain a stable gate dielectric. A water-soluble native Ge oxide that is typically present on the upper surface of a Ge-containing material causes the instability of the gate dielectric.

The recent developments of high-quality deposition techniques, such as atomic layer deposition (ALD) and metal-organic chemical vapor deposition (MOCVD), to deposit dielectric films with high dielectric constants (on the order of about 4.0 or greater, typically about 7.0 or greater) for the replacement of $SiO_2$ in Si metal oxide semiconductor field effect transistors (MOSFETs) has prompted activities to develop Ge MOSFETs implementing such dielectrics. The final surface preparation before high k film deposition is critical to the final MOS device performance.

For Ge, specifically, it appears essential to have a surface free (i.e., devoid) of germanium oxide before high k film deposition. A conventional solution for Si has been to use (concentrated or dilute) hydrofluoric acid (e.g., HF or DHF) to remove any native Si oxide, while leaving an H-passivated surface. Despite being successful for Si CMOS device fabrication, this surface passivation technique was found to be less effective on Ge. See, for example, D. Bodlaki, et al. "Ambient stability of chemically passivated germanium interfaces", Surface Science 543, (2003) 63-74. For high dielectric constant films such as, for example, $HfO_2$ and $Al_2O_3$, deposited onto HF or DHF treated materials, poor electronic properties of the gate stack are typically found. Other acid treatments, such as HCl, result in similarly poor electrical characteristics. This is illustrated by a set of C-V characteristics (see, FIG. 1) of an exemplary gate stack that was fabricated by (i) providing an epi-ready Ge (100) material; (ii) wet chemical cleaning by ozonated deionized (DI) water for 60 seconds, followed by addition of HCl to the solution for 60 seconds, and then DI water rinse for 300 seconds; (iii) deposition of 50 Å $HfO_2$ by ALD from $Al(CH_3)_3$ and water vapor at 300° C.; and (iv) evaporation of Al dots using a shadow mask to form MOS capacitors.

The high frequency dispersion and low capacitance modulation between accumulation and inversion are a strong indication of a very high areal density of interface states ($D_{it}$). This low electronic quality of the interface probably arises from the formation of undesirable interfacial compounds. Usually, germanium oxide ($GeO_2$) is held responsible, but Hf germanate or other compounds are possible candidates.

One demonstrated method to fabricate functional gate stacks is to desorb the Ge oxide in an ultra-high vacuum (UHV) system at high temperatures (e.g., at 400° to 650° C.) followed by in-situ high k deposition. X.-J. Zhang, et al., J. Vac. Sci. Technology A11, 2553 (1993) describe thermal desorption of Ge oxide, while J. J.-H. Chen, et al. IEEE Trans. Electron Dev. 51, 1441, (2004) describe the in-situ deposition process. The main drawback of this approach is that UHV systems are costly and generally incompatible with standard ALD or MOCVD high k deposition tools used in manufacturing. A practical solution is based on nitridation of a wet-etched (e.g., using DHF) Ge surface prior to dielectric deposition using either atomic N exposure or a high-temperature $NH_3$ gas treatment. See, for example, Chi On Chui, et al., IEEE Electr. Device Lett. 25, 274 (2004), E. P. Gusev, et al., Appl. Phys. Lett. 85, 2334 (2004) and N. Wu, et al. Appl. Phys. Lett. 84, 3741 (2004).

That nitrided stacks can be functional is exemplified by the C-V characteristics (see FIG. 2) of a gate stack fabricated in the same way as the stack discussed above in connection with FIG. 1, however, with an additional $NH_3$ treatment (at 650° C. for 1 minute) added between the wet HCl clean and $HfO_2$ deposition. The characteristics shown in FIG. 2 indicate greatly improved electrical characteristics than those shown in FIG. 1. Moreover, the characteristics illustrated in FIG. 2 show only a small frequency dispersion as compared to FIG. 1 indicating that the interface density had been reduced. The hysteresis is due to some dielectric traps in the $HfO_2$ film. However, despite the success in reducing the interface state density, the nitridation induces fixed positive charge at the interface which causes a large negative flatband shift and could degrade the device mobility. The nitridation step also has the disadvantage of requiring high-temperatures which could lead to unwanted dopant diffusion and interface reactions.

Sulfur passivation of Ge surfaces using an aqueous ammonium sulfide $(NH_4)_2S$ treatment (with other solvents such as methanol optionally added) has been described in the literature. See, for example, G. W. Anderson, et al., Appl. Phys. Lett. 66, 1123 (1995); P. F. Lyman, et al., Surf. Sci. 462, L594 (2000); D. Bodlaki, et al., J. Chem. Phys. 119, 3958 (2003); and Bodlaki, et al. Surf. Sci. 543, 63 (2003). The sulfur or germanium sulfide ($GeSi_x$) layer thus created using these techniques has a thickness of up to 3 monolayers. However, no application to MOSFET or MOS device fabrication of high k dielectric deposition has been suggested or demonstrated. Furthermore, the aforementioned cited literature does not indicate whether S treatment could be used for high k gate stack passivation.

In view of the above, it would be highly advantageous to have a method of preparing a Ge/high k interface that offers the following attributes:

1. low temperature passivation, so that the Ge FET fabrication flow could be milder, reducing unwanted diffusion or reaction;
2. wet-chemical application to provide process simplicity and reduce cost; and
3. improved electrical characteristics including a low interface state density and low flatband shift.

SUMMARY OF THE INVENTION

The present invention provides a method and structure in which Ge-based semiconductor devices such as FETs and MOS capacitors can be obtained. Specifically, the present invention provides a method of forming a semiconductor device including a stack of a dielectric and a conductive material located on and/or within a Ge-containing material (layer or wafer) in which the surface thereof (upper and/or trench wall surface) is non-oxygen chalcogen rich. That is, the present invention provides a non-oxygen chalcogen rich interface between the Ge-containing material and the dielectric. By providing a non-oxygen chalcogen rich interface, the formation of undesirable interfacial compounds during and after dielectric growth is suppressed and interfacial traps are reduced in density.

By "non-oxygen chalcogen rich" it is meant that the interfacial layer (or region) between the dielectric and the Ge-containing material has a non-oxygen chalcogen content of about $10^{12}$ atoms/cm$^2$ or greater. Typically, the non-oxygen chalcogen rich interface formed in the present invention has a non-oxygen chalcogen content from about $10^{12}$ to about $10^{17}$ atoms/cm$^2$, with a non-oxygen chalcogen content from about $10^{14}$ to about $10^{16}$ atoms/cm$^2$ being even more typical.

The term "non-oxygen chalcogen" is used throughout the present application to denote sulfur (S), selenium (Se), tellurium (Te), polonium (Po), or a mixture thereof. Typically, the non-oxygen chalcogen is S. The non-oxygen chalcogen rich interface may include at least one layer of the non-oxygen chalcogen atoms or it may include at least one layer of a compound containing non-oxygen chalcogen atoms.

In general terms, the method of the present invention comprises:

treating a surface of a Ge-containing material with at least one non-oxygen chalcogen-containing material to form a surface that is non-oxygen chalcogen rich;

forming a dielectric layer on said surface that is non-oxygen chalcogen rich, whereby an interface that is non-oxygen chalcogen rich is located between said Ge-containing material and said dielectric layer; and forming a conductive material on said dielectric layer.

In addition to the method described above, the present invention also relates to a semiconductor structure that is formed utilizing the inventive method. Specifically, and in general terms, the semiconductor structure of the present invention comprises:

a Ge-containing material, a dielectric layer located on a surface of said Ge-containing material; and a conductive material located on said dielectric layer, wherein an interface that is non-oxygen chalcogen rich is present between said dielectric layer and said Ge-containing material.

It is emphasized that the method of the present invention described above may provide a low temperature passivation, so that the Ge semiconductor device fabrication flow could be milder, reducing unwanted diffusion or reaction. Moreover, the surface passivation can be performed utilizing wet-chemical application to provide process simplicity and reduce cost.

Furthermore, the inventive method may provide improved electrical characteristics including a low interface state density and a low flatband shift.

The term "low interface state density" as used throughout the present application denotes an areal density of slow interface traps of typically about $1 \times 10^{13}$ cm$^{-2}$/eV or less, and more typically of about $1 \times 10^{12}$ cm$^{-2}$/eV or less, while the term "low flatband shift" denotes a flatband voltage shift compared to the ideal flatband voltage of about ±1 V or less, and more typically of about ±0.3 V or less.

DETAILED DISCUSSION OF THE INVENTION

The present invention, which provides Ge-based semiconductor devices fabricated using a non-oxygen chalcogen surface passivation step, will now be described in greater detail by referring to the following discussion and accompanying drawings. It is noted that the drawings of the present invention illustrating the various processing steps are provided for illustrative proposes and, as such, those drawings are not drawn to scale.

It is noted that the semiconductor devices that can be formed in the present invention include, for example, MOS capacitors, FETs, floating gate FET nonvolatile memory, dynamic random access memory (DRAM) and any other types of semiconductor devices that include a stack of a dielectric and a conductive material. The processes for forming these types of devices are well known to those skilled in the art and thus they will not be further elaborated on herein. What is discussed in detail is the surface passivation step and the formation of a stack comprising a dielectric and a conductive material. In the fabrication of DRAMs, the surface passivation described herein occurs inside a trench as well that is formed within a Ge-containing material by lithography and etching. That is, bare trench sidewalls can be subjected to the passivation step of the present invention together with an upper surface of the Ge-containing material. The basic processing steps of the present invention for fabricating, a semiconductor structure on a Ge-containing material are illustrated in FIGS. 3A-3C.

Figure 3A:
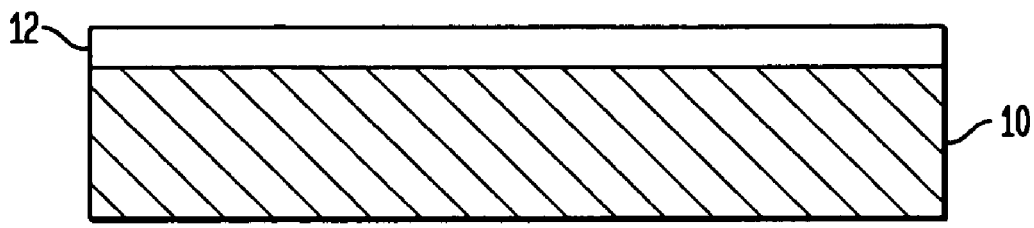
FIGS. 3A-3C are pictorial representations (through cross sectional views) illustrating the basic processing steps of the present invention.
Figure 3B:
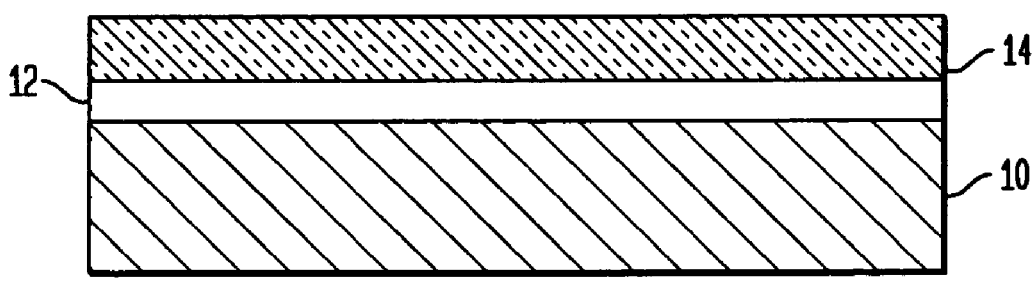
Figure 3C:
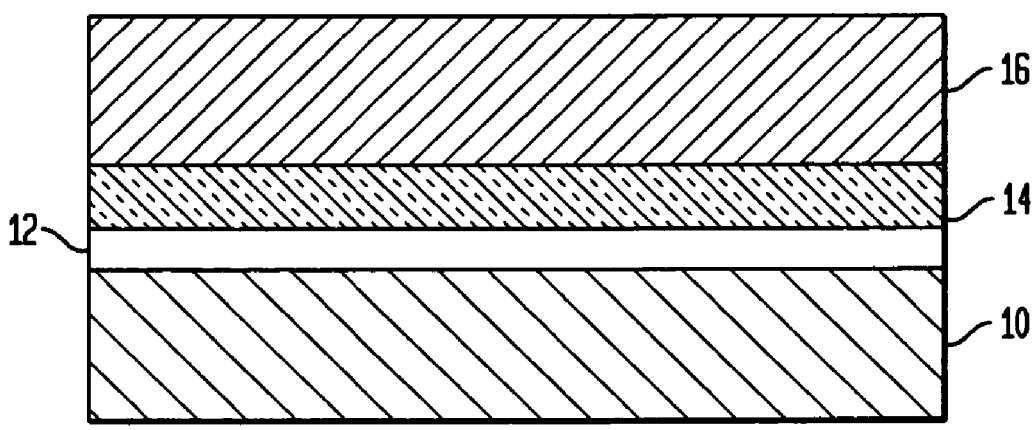
Figure 4:
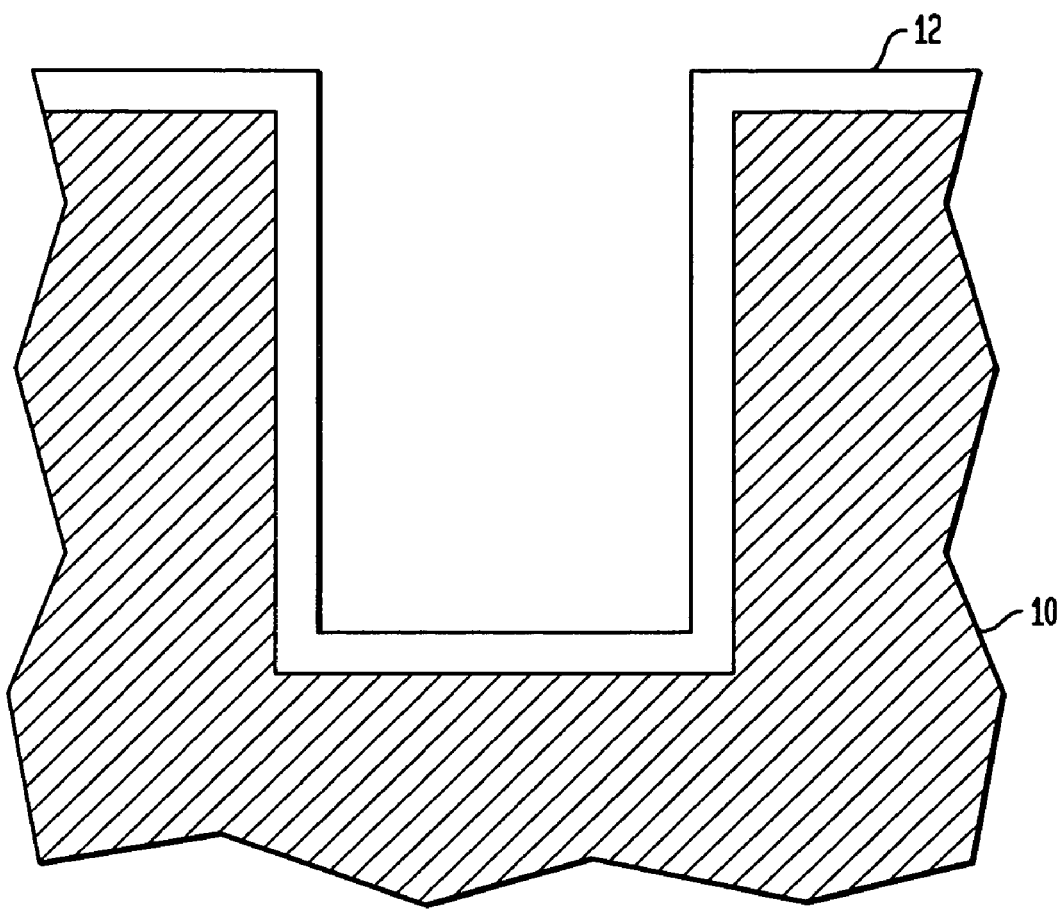
FIG. 4 is a pictorial representation (through a cross sectional view) depicting an embodiment in which passivation occurs in an upper surface of a Ge-containing material as well as bare sidewalls of a trench that is located within the Ge-containing material.

FIG. 3A illustrates a structure that is formed after subjecting a Ge-containing material 10 to the inventive non-oxygen chalcogen surface passivation step. As shown, the Ge-containing material 10 after this passivation step includes an upper surface layer or region 12 which is enriched with a non-oxygen chalcogen (i.e., rich in non-oxygen chalcogen). It is noted that surface region 12 (or layer) also includes Ge.

The germanium (Ge)-containing material 10 employed in the present invention is any semiconductor layer or wafer that includes Ge. Illustrative examples of such Ge-containing materials that can be used in the present invention include, but are not limited to: pure Ge, a Ge-on-insulator, SiGe, SiGeC, SiGe on a Si layer, a Ge layer on Si, or a layer of SiGeC on Si. The Ge-containing material 10 typically contains at least 10 atomic % Ge, with a Ge content of greater than 50 atomic % being even more typical. The Ge-containing material 10 may be doped, undoped or contain doped and undoped regions therein. In some embodiments of the present invention, the Ge-containing material 10 can be under a strain.

The thickness of the Ge-containing material 10 may vary and is not critical in practicing the present invention. Typically, the Ge-containing material 10 has a thickness from about 1 nm to about 1 mm.

The upper surface layer or region 12 of the Ge-containing material 10 that is enriched with a non-oxygen chalcogen is formed by treating a bare surface of the Ge-containing material with at least one non-oxygen chalcogen-containing material. The term "non-oxygen chalcogen" is used throughout the present application to denote sulfur (S), selenium (Se), tellurium (Te), polonium (Po), or a mixture thereof. Typically, the non-oxygen chalcogen is S. The at least one non-oxygen chalcogen-containing material may be a liquid or vapor.

When a liquid is used, the non-oxygen chalcogen-containing material is typically used in conjunction with a solvent such as, for example, water, an alcohol including, for instance, methanol or ethanol, and other like protic (hydroxylic) solvents. Neat non-oxygen chalcogen-containing liquids are also contemplated in the present invention.

In this embodiment of the present invention, the non-oxygen chalcogen-containing material is present in the solvent in an amount that is greater than $10^{-6}$%, preferably greater than 0.01%, and even more preferably greater than 0.1%. The non-oxygen chalcogen-containing material used in this embodiment of the present invention comprises any compound that includes at least one non-oxygen chalcogen. Examples of non-oxygen chalcogen-containing materials that can be used in this embodiment of the present invention include, but are not limited to: ammonium sulfide $(NH_4)_2S$, ammonium selenide $(NH_4)_2Se$, ammonium telluride $(NH_4)_2Te$, hydrogen sulfide $H_2S$, hydrogen selenide $H_2Se$, hydrogen telluride, $H_2Te$, an alkaline metal non-oxygen chalcogenide such as $Na_2S$ or $K_2S$, a complex of two non-oxygen chalcogenides such as, for example, $SeS_2$, or a phosphate of a non-oxygen chalcogenide such as, for example, $P_2S_5$. In one preferred embodiment, ammonium sulfide is used as the non-oxygen chalcogen-containing material.

The liquid non-oxygen chalcogen-containing material is applied to the surface of the Ge-containing material utilizing techniques well known in the art including, for example, dip coating, brush coating, immersion and other like techniques. This treatment may be performed at any temperature or time so long as the conditions do not have a negative influence on the Ge-containing material 10. Typically, the treatment using a liquid non-oxygen chalcogen-containing material is performed at a temperature from about 0° C. to about 150° C. for a time period from about 1 second to about 1 day. More typically, the treatment using a liquid non-oxygen chalcogen-containing material is performed at a temperature from about 15° C. to about 100° C. for a time period of about 1 minute to 1 hour. In one preferred embodiment, the treatment using a liquid non-oxygen chalcogen-containing material is performed at a temperature from about 70° C. to about 80° C. for a time period of about 10 minutes.

When a vapor is used for this treatment step, one of the above mentioned liquid non-oxygen chalcogen-containing material is first vaporized utilizing techniques well known in the art and then the vapor is passed over the Ge-containing material 10. The vapor may include atomic species, molecular species or clustered species. Contact with a vapor may be performed for various periods of time including the ranges mentioned above.

Notwithstanding whether a liquid or vapor is used, this treatment passivates the Ge-containing material 10 by removing any undesirable compounds such as Ge oxide from the surface of the Ge-containing material, or by modifying such undesirable compounds such as Ge oxide. Instead, of having undesirable compounds such as Ge oxide at the surface of the Ge-containing, a surface region which is non-oxygen chalcogen rich is formed. By "non-oxygen chalcogen rich" it is meant that the interfacial layer (or region) between the dielectric and the Ge-containing material has a non-oxygen chalcogen content of about $10^{12}$ atoms/cm$^2$ or greater. Typically, the non-oxygen chalcogen rich interface formed in the present invention has a non-oxygen chalcogen content from about $10^{12}$ to about $10^{17}$ atoms/cm$^2$, with a non-oxygen chalcogen content from about $10^{14}$ to about $10^{16}$ atoms/cm$^2$ being even more typical.

The depth of the upper surface region 12 that is non-oxygen chalcogen rich may vary depending upon the conditions of the passivation step. Typically, the depth of surface region 12 is from about 1 to about 100 monolayers. It is noted that the concentration of non-oxygen chalcogen within region or layer 12 may be continuous or it may be graded, with a higher non-oxygen chalcogen content typically present in the uppermost surface of the Ge-containing material 10.

In some embodiments of the present invention, a conventional surface preparation process may be optionally performed prior to the above described non-oxygen chalcogen passivation step. An illustrative example of one type of surface preparation process that can be performed prior to non-oxygen chalcogen passivation includes: 5:1 $H_2SO_4$:$H_2O$ treatment for 2 minutes, rinsing in DI water, and etching the Ge surface with 10% HF (aq) for 10 minutes.

In some embodiments of the present invention, a conventional rinsing/drying process may be optionally employed after performing the above described passivation step. An illustrative example of one type of rinsing/drying process that can be performed after non-oxygen chalcogen passivation, but prior to dielectric formation, includes: rinsing in water or an organic solvent, or in a mixture thereof, and then drying by blowing $N_2$ or another inert gas over the passivated surface.

The present invention contemplates passivation only, surface preparation and passivation, passivation and rinsing and drying or surface preparation, passivation and rinsing and drying.

A dielectric 14 is formed on the non-oxygen chalcogen rich surface 12 of the Ge-containing material 10. The dielectric 14 can serve as a gate dielectric of a FET or an insulator between two capacitor electrodes. The dielectric 14 can be formed by a thermal growth process such as, for example, oxidation, nitridation or oxynitridation. Alternatively, the dielectric 14 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The dielectric 14 may also be formed utilizing any combination of the above processes.

The dielectric 14 is comprised of an insulating material preferably having a dielectric constant of about 4.0 or greater, preferably greater than 7.0. The dielectric constants mentioned herein are relative to a vacuum. Note that $SiO_2$ typically has a dielectric constant that is about 4.0. Specifically, the dielectric 14 employed in the present invention includes, but is not limited to: an oxide, nitride, oxynitride and/or silicates including metal silicates, aluminates, titanates and nitrides. In one embodiment, it is preferred that the dielectric 14 is comprised of an oxide such as, for example, $SiO_2$, $GeO_2$, $HfO_2$, $ZrO_2$, $Al_2O_3$, $TiO_2$, $La_2O_3$, $SrTiO_3$, $LaAlO_3$, $Y_2O_3$ and mixtures thereof, as well as graded and layered stacks of such materials and their mixtures. Highly preferred examples of dielectrics 14 include $HfO_2$, hafnium silicate and hafnium silicon oxynitride.

The physical thickness of the dielectric 14 may vary, but typically, the dielectric 14 has a thickness from about 0.5 to about 10 nm, with a thickness from about 0.5 to about 4 nm being more typical. It may be deposited on a thin (on the order of about 0.1 to about 1.5 nm) layer of silicon oxide or silicon oxynitride that is first deposited on the Ge-containing material 10 including the enriched non-oxygen chalcogen surface layer 12.

At least one isolation region (not shown) is typically formed into the Ge-containing material 10 at this point of the present. The isolation region is typically a trench isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well.

FIG. 3B shows the structure including the dielectric 14 formed atop the non-oxygen chalcogen rich surface 12 of Ge-containing material 10. It is noted that after deposition of dielectric 14 the non-oxygen chalcogen rich surface 12 forms an interfacial layer between the dielectric 14 and the Ge-containing material 10. The non-oxygen chalcogen rich interface may include at least one layer of the non-oxygen chalcogen atoms or it may include or it may include at least one layer of a compound containing non-oxygen chalcogen atoms. The concentration of non-oxygen chalcogen and the thickness of the surface layer 12 (i.e., the interface region) may or may not be effected by the deposition of the dielectric 14.

After forming the dielectric 14, a blanket layer of a conductive material 16 is formed on the dielectric 14 utilizing a known deposition process such as physical vapor deposition (PVD), CVD or evaporation. The conductive material 16 may comprise, but is not limited to: polycrystalline silicon ('polysilicon'), SiGe, a silicide, a germanide, a metal, a metal nitride or a metal-silicon-nitride such as Ta—Si—N. Preferably, for substrates with a very high concentration of Ge (a Ge content on the order of about 50% or greater) the conductive material 16 is comprised of a metal. Examples of metals that can be used as the conductive material 16 include, but are not limited to: Al, W, Cu, Ti, Re, or other like conductive metals.

The blanket layer of conductive material 16 may be doped or undoped. If doped, an in-situ doping deposition process may be employed. Alternatively, a doped conductive material 16 can be formed by deposition, ion implantation and annealing, by deposition and diffusion, or by any process known to those skilled in the art.

The doping of the conductive material 16 will shift the workfunction of the gate formed. Illustrative examples of doping ions include As, P, B, Sb, Bi, In, Al, Tl, Ga or mixtures thereof. The thickness, i.e., height, of the conductive material 16 deposited at this point of the present invention may vary depending on the deposition process employed. Typically, the conductive material 16 has a vertical thickness from about 20 to about 180 nm, with a thickness from about 40 to about 150 nm being more typical.

In some embodiments, an optional hardmask (not shown) may be formed atop the conductive material 16 utilizing a conventional deposition process. The optional hardmask can be comprised of a dielectric such as an oxide or nitride.

FIG. 3C shows the structure including the conductive material 16 formed atop the dielectric 14. At this point of the inventive process conventional CMOS processing steps can be performed to form any type of semiconductor device including, for example, FETs and/or MOS capacitors.

It is emphasized that the method of the present invention described above may provide a low temperature passivation, so that the Ge CMOS fabrication flow can be milder, reducing unwanted diffusion or reaction. Moreover, the surface passivation can be performed utilizing wet-chemical application to provide process simplicity and reduce cost. Furthermore, the inventive method may provide improved electrical characteristics including a low interface state density and a low flatband shift.

The term "low interface state density" as used throughout the present application denotes an areal density of slow interface traps of typically about $1\times10^{13}$ $cm^{-2}/eV$ or less, and more typically of about $1\times10^{12}$ $cm^{-2}/eV$ or less, while the term "low flatband shift" denotes a flatband voltage shift compared to the ideal flatband voltage of about $\pm 1$ V or less, and more typically of about $\pm 0.3$ V or less.

In some embodiments of the present invention, at least one trench 20 is formed into a Ge-containing material 10 utilizing lithography and etching. The depth of each trench 20 formed at this point of the present invention is determined by the length of the etching process. Typically, and for DRAM structures, each trench 20 has a depth from about 1 to about 10 μm. The passivation step described above is then performed providing the non-oxygen chalogen rich interface 12. Dielectric 14 and conductive material 16 are then formed at least within the trench 20 as described above. The passivation step is this embodiment may effect the upper surface of the Ge-containing material 10, if bare, or any or all parts of the trench sidewalls, if they are bare.

In some embodiments, a patterned mask can be formed on a surface of a Ge-containing material and then the above surface passivation step is performed. This embodiment forms non-oxygen chalcogen rich regions on surfaces of the Ge-containing material not including the patterned mask.

The following example is provided to illustrate the present invention and some advantages that can be obtained from utilizing the inventive non-oxygen chalcogen passivation process.

EXAMPLE

In this example, a MOS capacitor in which a Ge-containing material was first passivated with sulfur and thereafter a $HfO_2$ dielectric was deposited on the sulfur surface passivated Ge-containing material was prepared. Specifically, the MOS capacitor was prepared by first providing an epi-ready n-Ge (100) material. The surface of the Ge material was then subjected to a wet-chemical precleaning process that included degreasing the surface of the Ge material using an acetone/methanol mixture, treating the degreased surface with a 5:1 $H_2SO_4$:$H_2O$ treatment for 2 minutes, rinsing in DI water, and etching the Ge surface with 10% HF (aq) for 10 minutes. Following this wet-chemical precleaning process, the Ge-containing material was sulfur passivated utilizing a 50% $(NH_4)_2S$ (aq) treatment at a temperature between 70°-80° C. for 10 minutes. Following the sulfur passivation, the Ge material was subjected to rinsing in water and then the material was dried by blowing $N_2$ over the sulfur-passivated surface. Next, a 77 Å $HfO_2$ dielectric was deposited on the sulfur passivated surface by atomic layer deposition (ALD) from a vapor including $Al(CH_3)_3$ and water. The ALD was performed at 220° C. Al dots were then formed over the dielectric layer using a shadow mask.

Figure 5:
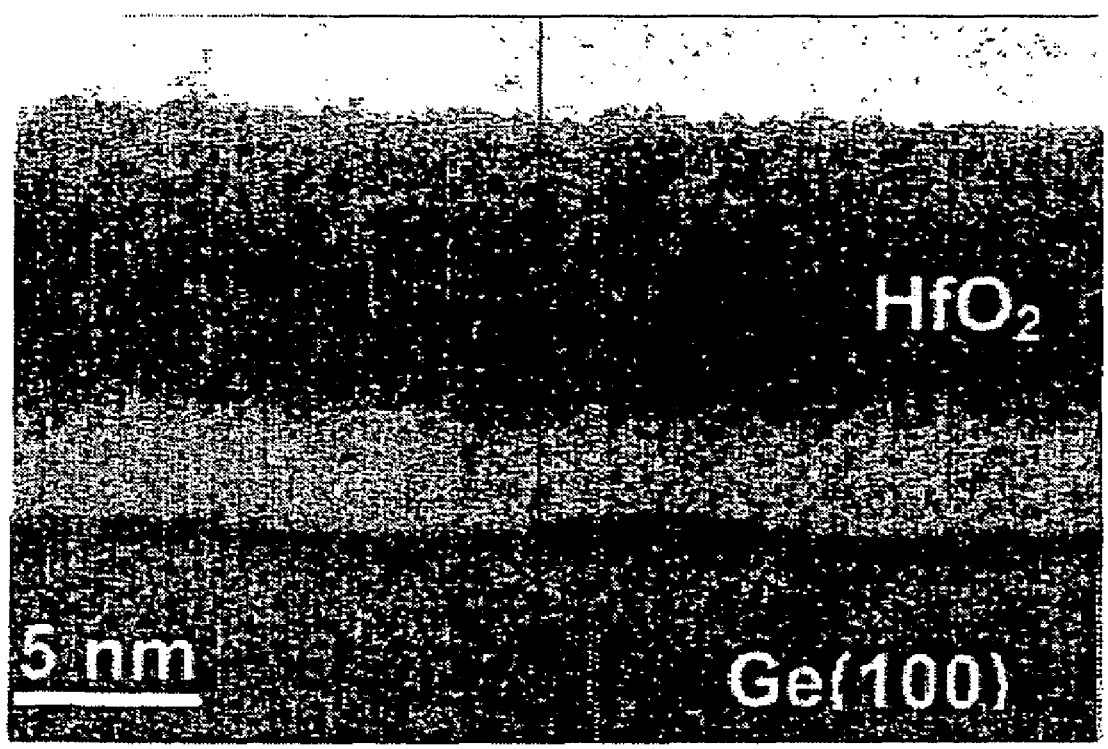
FIG. 5 is a transmission electron microscopic (TEM) image of a gate stack that has been passivated utilizing the invention passivation process described in the Example.

FIG. 5 shows a transmission electron microscopy (TEM) image of the gate stack with S passivation as in accordance with the present invention. A layer is present that separates the $HfO_2$ gate dielectric from the Ge substrate. Such a layer has not been detected when employing other Ge surface preparation techniques, such as HF etch, HCl etch, $NH_3$ anneal, and the like. This demonstrated that (a) S passivation can be stabilized during dielectric deposition, if appropriate deposition conditions (e.g., sufficiently low temperature) were chosen, and that (b) this process results in a gate stack structure that fundamentally differs from what is otherwise formed.

Figure 1:
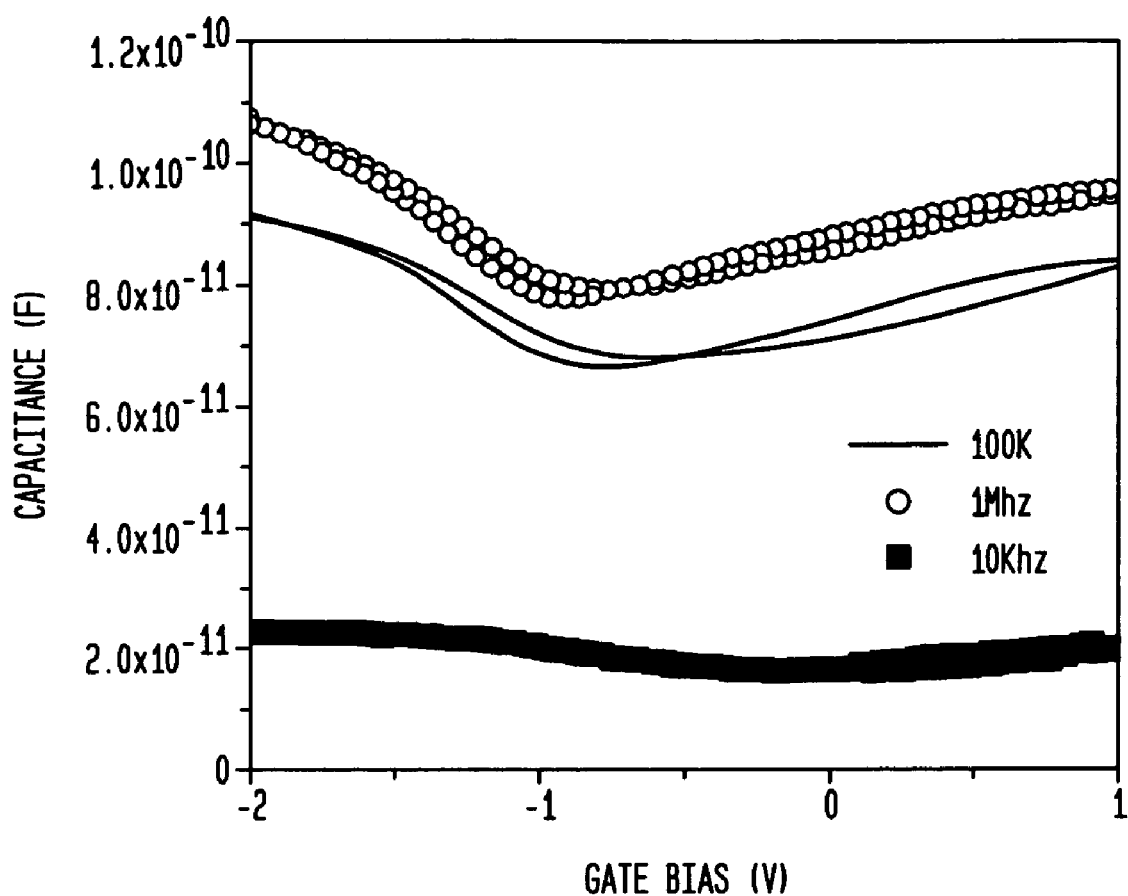
FIG. 1 is a graph of Capacitance (F) vs. Gate Bias (V) for a prior art gate stack fabricated upon a Ge-containing material that has been cleaned utilizing DI water and HCl.
Figure 2:
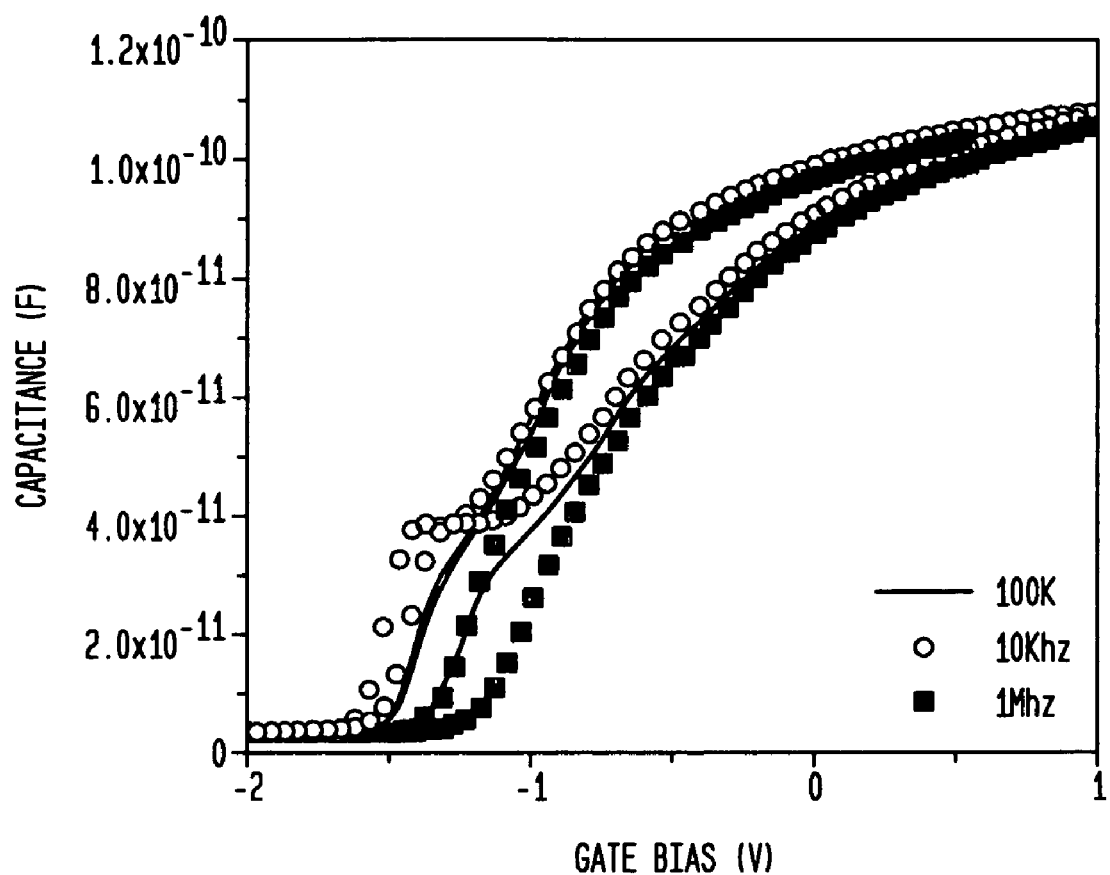
FIG. 2 is a graph of Capacitance (F) vs. Gate Bias (V) for a prior art gate stack fabricated upon a Ge-containing material that has been cleaned utilizing DI water and then nitrided with $NH_3$.
Figure 6:
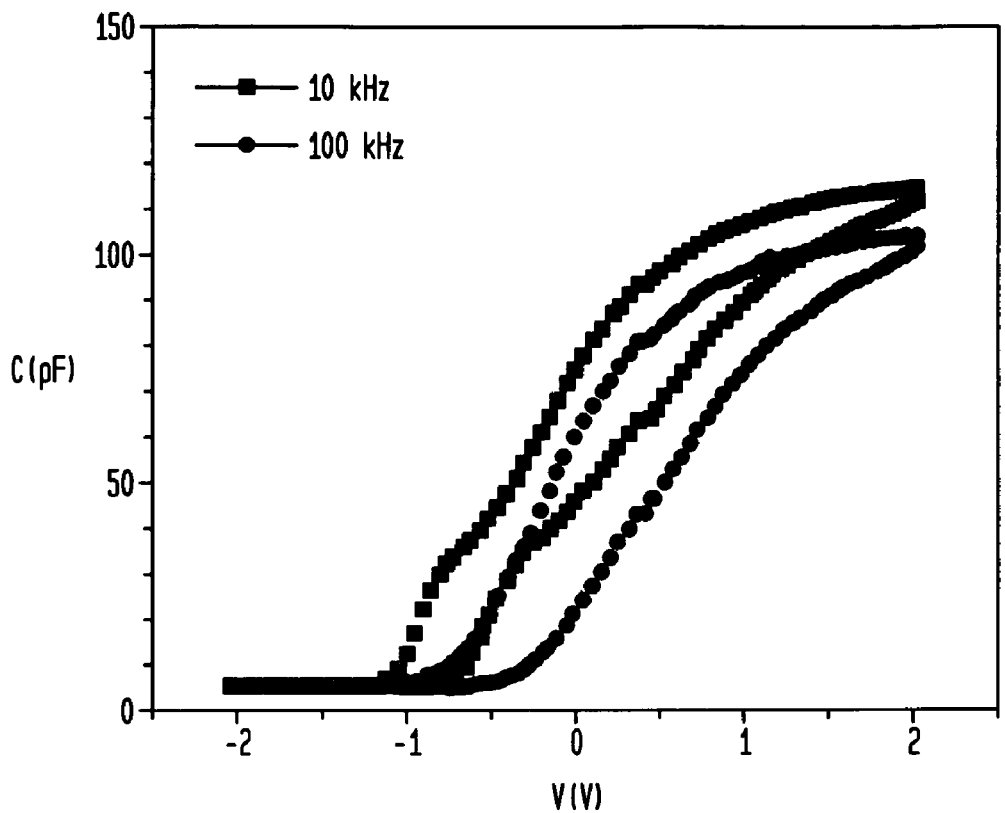
FIG. 6 is a graph of Capacitance (F) vs. Gate Bias (V) for a gate stack fabricated upon a Ge-containing material that has been subjected to the passivation process of the present invention.

For comparison, MOS capacitors were prepared using the surface treatment steps mentioned above in connection with FIGS. 1 and 2. FIG. 6 shows the C-V characteristics of the MOS capacitor of the present invention that has been prepared utilizing the inventive sulfur passivation step. The C-V characteristics illustrated by FIG. 6 are comparable in quality to those of the $NH_3$ nitrided Ge material, as shown in FIG. 2.

Figure 7:
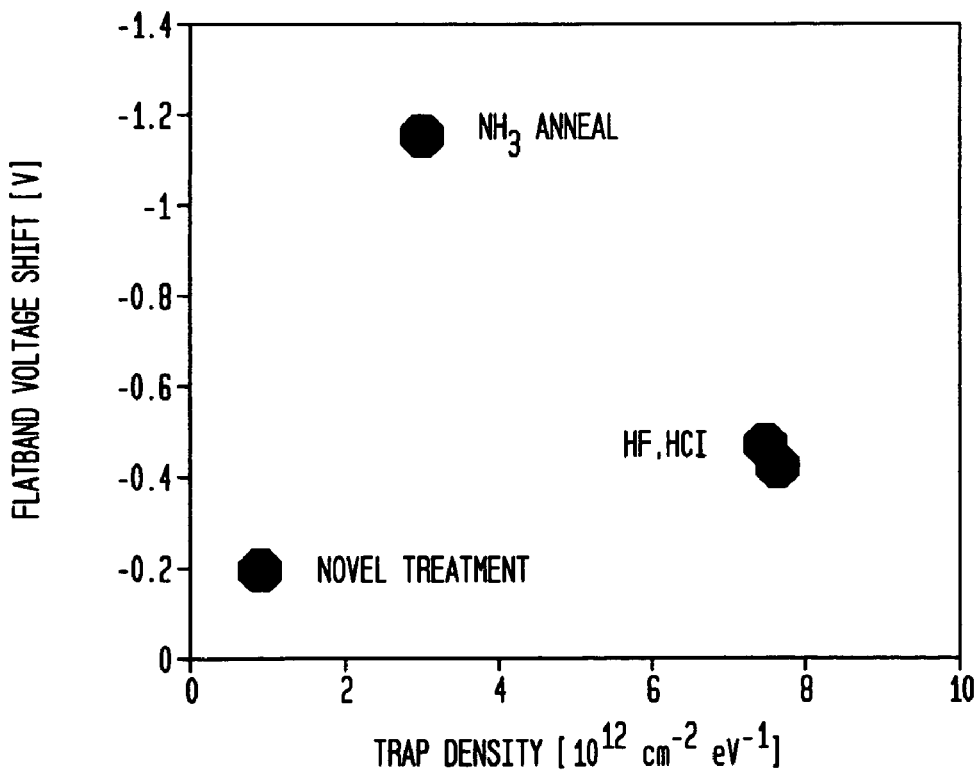
FIG. 7 is a graph of flatband voltage shift (V) vs. Trap Density ($10^{12}$ cm$^{-2}$ eV$^{-1}$) for various gate stacks fabricated upon a Ge-containing material that has been cleaned utilizing (a) $NH_3$ annealing (i.e., nitridation), (b) HF or HCl treatment, and (c) the inventive passivation process (denoted 'novel treatment').

Table 1 below and FIG. 7 show the extracted $D_{it}$ values and flatband shifts for the various capacitors described in this example. The data clearly shows that the sulfur-passivated sample had considerably lower $D_{it}$ than the other treatments. Without wishing to be bound by any theory, this result is believed to be attributable to the passivating effect of the sulfur which substantially inhibits the formation of undesirable compounds during and after $HfO_2$ deposition. The sulfur passivated sample also provided a smaller flatband shift as compared to prior art treatment process, e.g., nitridation and acid cleaning.

TABLE 1

| Treatment | Min. $D_{it}$ ($cm^{-2}$/eV) between f = 0.1 kHz and 1 MHz | Ave. flatband shift (V) at f = 100 kHz |
|---|---|---|
| HF (Prior art) | 7E12 | −0.43 |
| HCl (Prior art) | 8E12 | −0.48 |
| $NH_3$ anneal (Prior art) | 3E12 | −1.15 |
| $(NH_4)_2S$ (Inventive) | 9E11 | −0.20 |

It is believed that similar results can be obtained when the non-oxygen chalcogen is other than sulfur.

The above embodiments and example are given to illustrate the scope and spirit of the present invention. These embodiments and example will make apparent, to those skilled in the art, other embodiments and examples. Those other embodiments and examples are within the contemplation of the present invention. Therefore, the present invention should be limited only by appended claims.

What is claimed is:

1. A method of forming a semiconductor structure comprising:
   treating a bare surface of a Ge-containing material with at least one non-oxygen chalcogen-containing material to form a surface that is non-oxygen chalcogen rich;
   forming a dielectric layer having a dielectric constant of about 4.0 or greater on said surface that is non-oxygen chalcogen rich, whereby an interface that is non-oxygen chalcogen rich is located between said Ge-containing material and said dielectric layer; and
   forming a conductive material on said dielectric layer, said interface that is non-oxygen chalcogen rich provides a stack of said dielectric and said conductive material that has an areal density of slow interface traps of about $1\times10^{13}$ $cm^{-2}$/eV or less and a flatband voltage shift of about ±1 V or less.

2. The method of claim 1 further comprising performing a surface preparation process prior to said treating.

3. The method of claim 1 further comprising performing a rinsing/drying process after said treating and prior to forming said dielectric.

4. The method of claim 1 further comprising performing a surface preparation process prior to said treating and performing a rinsing/drying process after said treating and prior to forming said dielectric.

5. The method of claim 1 wherein said non-oxygen chalcogen-containing material is a liquid or a vapor.

6. The method of claim 1 wherein said interface that is non-oxygen chalcogen rich has a non-oxygen chalcogen content of about $10^{12}$ atoms/$cm^2$ or greater.

7. The method of claim 1 wherein said non-oxygen chalcogen-containing material comprises ammonium sulfide $(NH_4)_2S$, ammonium selenide $(NH_4)_2Se$, ammonium telluride $(NH_4)_2Te$, hydrogen sulfide $H_2S$, hydrogen selenide $H_2Se$, hydrogen telluride, $H_2Te$, an alkaline metal non-oxygen chalcogenide, a complex of two non-oxygen chalcogenides or a phosphate of a non-oxygen chalcogenide.

8. A method of forming a semiconductor structure comprising:
   treating a bare surface of a Ge-containing material with at least one sulfur-containing material to form a surface that is sulfur rich;
   forming a dielectric layer having a dielectric constant of about 4.0 or greater on said surface that is sulfur rich, whereby an interface that is sulfur rich is located between said Ge-containing material and said dielectric layer; and
   forming a conductive material on said dielectric layer, said interface that is sulfur rich provides a stack of said dielectric and said conductive material that has an areal density of slow interface traps of about $1\times10^{13}$ $cm^{-2}$/eV or less and a flatband voltage shift of about ±1 V or less.

9. The method of claim 7 wherein said non-oxygen chalcogen-containing material is ammonium sulfide in liquid or vapor form.

* * * * *